(12) United States Patent
Fu et al.

(10) Patent No.: US 9,025,133 B2
(45) Date of Patent: May 5, 2015

(54) LASER INTERFERENCE LITHOGRAPHY APPARATUS USING FIBER AS SPATIAL FILTER AND BEAM EXPANDER

(71) Applicant: National Tsing Hua University, Hsinchu (TW)

(72) Inventors: Chien-Chung Fu, Hsinchu (TW); Yi-Lin Sun, Hsinchu (TW); David Gerard Mikolas, New Taipei (TW); Pao-Te Lin, Hsinchu (TW); En-Chiang Chang, Nantou County (TW); Tze-Bin Huang, Taipei (TW)

(73) Assignee: National Tsing Hua University, Hsinchu (TW)

( * ) Notice: Subject to any disclaimer, the term of this patent is extended or adjusted under 35 U.S.C. 154(b) by 209 days.

(21) Appl. No.: 13/800,072

(22) Filed: Mar. 13, 2013

(65) Prior Publication Data
US 2014/0118715 A1 May 1, 2014

(30) Foreign Application Priority Data
Oct. 29, 2012 (TW) .............................. 101139863 A (51) Int. Cl.
G03B 27/72 (2006.01)
G03B 27/42 (2006.01)
G03F 7/20 (2006.01)

(52) U.S. Cl.
CPC .................................. *G03F 7/70408* (2013.01)

(58) Field of Classification Search
CPC ....................................................... G03F 7/70408
USPC .................. 355/53, 67–71; 359/577–578, 584
See application file for complete search history.

(56) References Cited

U.S. PATENT DOCUMENTS

| | | | | |
|---|---|---|---|---|
| 6,002,466 A * | 12/1999 | Brauch et al. | .................. | 355/53 |
| 6,672,739 B1 * | 1/2004 | Argyle et al. | .................. | 362/259 |
| 8,400,616 B2 * | 3/2013 | Fu | .................. | 355/67 |
| 2001/0035991 A1 * | 11/2001 | Hobbs et al. | .................. | 359/35 |

* cited by examiner

*Primary Examiner* — Hung Henry Nguyen
(74) *Attorney, Agent, or Firm* — Muncy, Geissler, Olds & Lowe, P.C.

(57) ABSTRACT

In a laser interference lithography apparatus, a laser source provides a first laser beam, and an optics assembly is optically coupled to the laser source and receives and processes the first laser beam into one or multiple second laser beams. An exposure stage carries a to-be-exposed object. The fiber assembly receives and processes the second laser beam(s) into one or multiple single mode and stable coherent third laser beams without spatial noise. An interference pattern is generated on the to-be-exposed object using the third laser beam(s). The apparatus is configured without a pin hole spatial filter and a beam expander being disposed on an optical path from an output end of the laser source to the exposure stage.

14 Claims, 8 Drawing Sheets

LASER INTERFERENCE LITHOGRAPHY APPARATUS USING FIBER AS SPATIAL FILTER AND BEAM EXPANDER

This application claims priority of No. 101139863 filed in Taiwan R.O.C. on Oct. 29, 2012 under 35 USC 119, the entire content of which is hereby incorporated by reference.

BACKGROUND OF THE INVENTION

1. Field of the Invention

The invention relates to a laser interference lithography (LIL) apparatus with one or more optical fibers.

2. Related Art

LIL has been a low-cost and well-established method to produce nano-scale surface patterns that have high resolutions. LIL uses coherent light beams, which are split and reflected so that two or more than two beams overlap in the space, and interference fringes and periodic structures are formed on a photosensitive layer such as photoresist. LIL has the following advantages. First, LIL does not require a photomask or an imaging projection lens set with high numerical aperture (NA) value, wherein the mask and the lens set are used in the conventional projection photolithography technology. Second, a simple single transverse mode laser can be used instead of a highly incoherent transverse mode laser requiring beam homogenizing technology as required in projection photolithography. Third, plane or spherical wave sources can be used such as those produced by simpler single transverse mode lasers, instead of broad angle of incidence photomask illumination with specified sizes and shapes of partial coherence. Thus, the optical diffraction and the expensive apparatus can be avoided. Fourth, LIL has a large depth of focus, and can significantly decrease the influence of the environment on the exposure. Fifth, the incident angle of interference can be modified to obtain the smaller period and line width without modifying the optical device and the optical design.

Using LIL, nano-scale patterns can be produced through direct use of the exposed photoresist, or the pattern can be transferred to other structures and materials using a variety of material depositing and etching techniques. These structures can further be used in processes including nanoimprint lithography to reproduce the structures further.

In many applications of these nanostructures, including high density magnetic recording media and photonic devices, their performance is highly dependent on feature details such as period and diameter or line width. Therefore, a variety of these structures must be explored experimentally. Therefore, a system capable of manufacturing the uniform nano-structure, quickly changing the period and the line width or diameter of the nano-structure, is extremely valuable to accelerate the progress in process and device development.

However, LIL needs the very high laser pointing stability. Under the nanometer scale, either the laser pointing drifting or the vibration causes the change of the period or position of the interference pattern, resulting in the loss in contrast ratio or pattern shape. In extreme cases no interference fringes can be recorded in the photoresist. Although the real-time correction can be performed using the precise measurement and control, the burden of the relatively high costs and complexity of the apparatus and the technique are a substantial disadvantage.

In addition, all laser sources will produce spatial noise to varying degrees. To prevent wasted heat generated by the laser from affecting the environment of the interference lithography, the laser source is usually disposed on an optical table away from the interference lithography. This requires additional optical elements in the laser beam path. Imperfection in these devices, including lenses, mirrors, and contaminants on their surfaces can produce further spatial noise. A short focal length lens is used to disperse the noise with the higher spatial frequency away from the optical axis of the laser beam during the light transmission process, and a pin hole is disposed to serve as a spatial filter for filtering out the spatial noise of the laser beam or filtering out the diffracted light beam caused by the defect of the optical device on the optical path.

However, the position of the pin hole has to be properly adjusted because the poor effect is caused when the pin hole is too close to or away from the laser source, or drifts laterally, perpendicular to the beam direction. Thus, a fringe-locking system is often required using a complicated optical mechanism, an optical detection device and a precise optical device in conjunction with the high-speed and real-time feedback system, and this establishing process is time consuming and adds substantially to the cost and complexity of construction and operation.

SUMMARY OF THE INVENTION

An object of the invention is to provide a laser interference lithography apparatus using one or more fibers with the transmission property to serve as and replace a spatial filter and a beam expander, to provide a physically flexible beam transport system without additional optical elements, and to provide a pure, stable and coherent laser beam as an exposure light source to perform the LIL process.

To achieve the above-identified object, the invention provides a laser interference lithography apparatus including a laser source, an optics assembly, an exposure stage and a fiber assembly. The laser source provides a first laser beam. The optics assembly is optically coupled to the laser source, receives the first laser beam and processes the first laser beam into one or multiple second laser beams. The exposure stage carries a to-be-exposed object. The fiber assembly receives the one or multiple second laser beams and processes the one or multiple second laser beams into one or multiple single mode and stable coherent third laser beams without spatial noise. Throughout this entire description and all embodiments, it is to be understood that the term "single mode fiber" in fact also includes the use of a low-order multimode fiber, operated in its lowest order mode. Further, either of these may be of the polarization maintaining or non-polarization maintaining type. A range of an operating wavelength of the fiber assembly covers the range of wavelengths of the laser and second laser beam, as well as a range of wavelength sensitivity of the photoresist, the wavelength range being approximately from 300 nanometers to 500 nanometers. An interference pattern is generated on the to-be-exposed object using the one or multiple third laser beams. An optical path is formed from an output end of the laser source to the exposure stage without a pin hole spatial filter and a beam expander being disposed on the optical path.

According to the above-mentioned aspect of the invention, the fiber can be used to filter out the spatial noise, so that the pure and stable single mode laser beam without the spatial noise can be provided for LIL.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
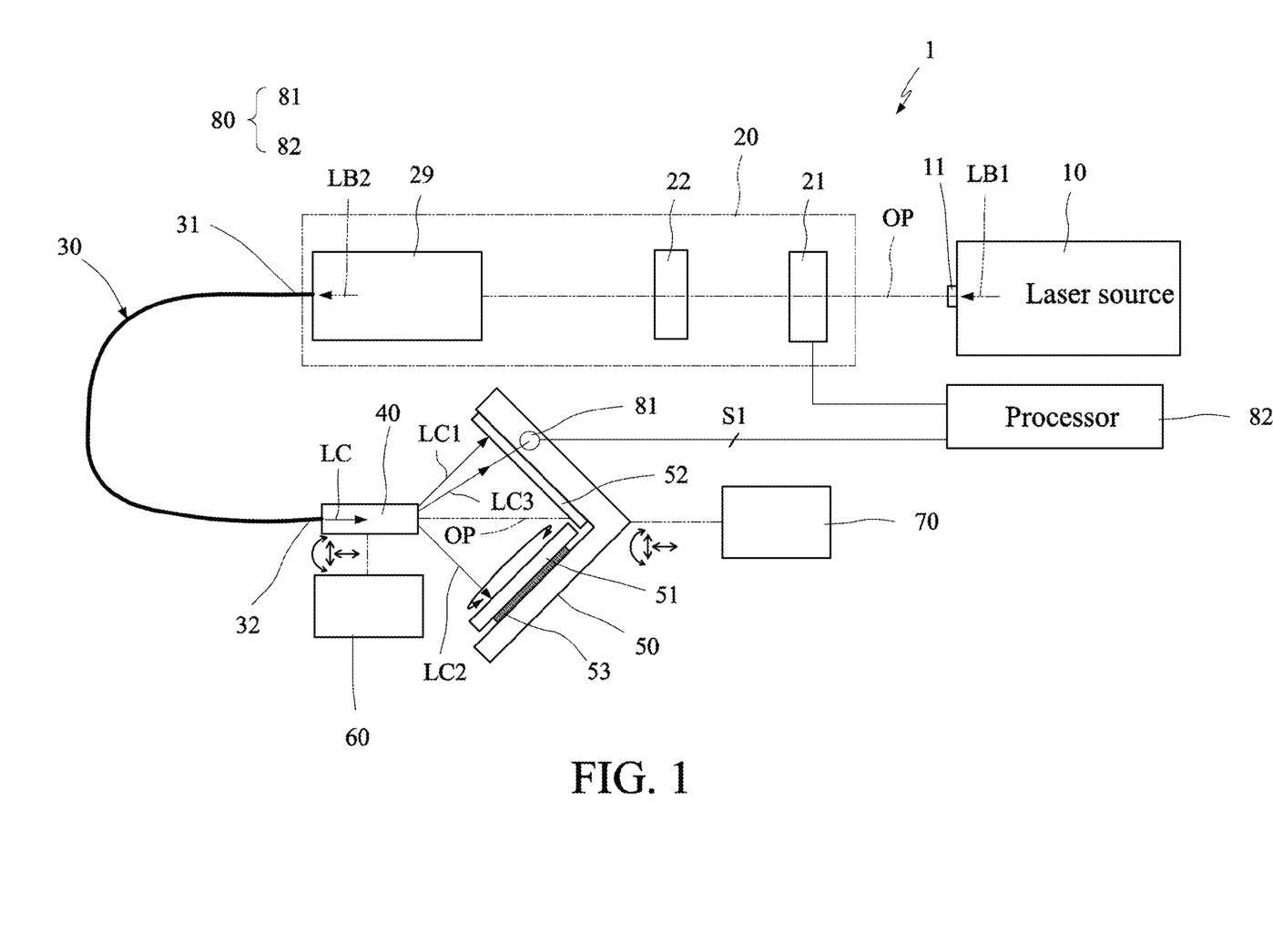
FIGS. 1 to 3 are schematic illustrations showing LIL apparatuses according to first to third embodiments of the invention, respectively.

Referring to FIG. 1, a laser interference lithography (LIL) apparatus 1 of this embodiment includes a laser source 10, an optics assembly 20, a fiber assembly 30, a holder 40 and an exposure stage 50. It is to be noted that the relative position relationships between the elements in FIG. 1 are only for the illustrative purpose only but do not intend to restrict the scope of the invention.

The laser source 10 provides a first laser beam LB1. In one embodiment, a helium (He) cadmium (Cd) laser operating at 325 nm is selected to serve as the ultraviolet (UV) light source. Because the He Cd laser operates with the relatively low power plasma, the thermal Doppler broadening of the laser is naturally relatively low (about 1 GHz). For LIL of the sample with the dimension of several centimeters, the corresponding coherent length (about 30 cm) is sufficiently long. Thus, no frequency selection is needed, and no external water cooling is needed. However, the invention is not particularly restricted thereto. Other laser sources, such as krypton (Kr), argon (Ar) ion laser sources, or solid state or semiconductor lasers or the like, may also be used, such that the longitudinal coherence length of the laser is substantially longer than the size of the exposed sample.

However, we have found that the He Cd laser sometimes has the issues with the quality of the beam shape and the pointing stability. Even with conventional spatial filters, (e.g., pinholes), these can have a serious impact on the quality and stability of an LIL exposure system. The laser beam shape directly affects the intensity pattern on the sample, and the pointing stability can cause the position of the apparent source of the beam to drift. Thus, this embodiment does not adopt the conventional pin hole spatial filter and seeks for other solutions, in which optical fibers, including multi-mode, single mode and polarization maintaining single mode fibers, are adopted. After the experimental verification, the optical fiber can provide the flexible light transmission path and can replace the conventional pin hole spatial filter and beam expander, wherein the details will be described later. Of course, a low order multi-mode fiber may also be adopted. Under certain combinations of wavelength and optical fiber design, such as core diameter and index difference, a given fiber may operate in single mode or low-order multimode transmission. The single, lowest order mode is the desired mode of propagation. Since in the current invention the fiber is not long (0.3 to 0.5 meters in one example, usually smaller than or equal to 2 meters), the single mode propagation can be maintained. This is because the miniaturized LIL apparatus is a design consideration in this embodiment. Thus, the optical mode has not transformed in such the short distance, and the multi-mode fiber is thus applicable to the invention. Further, optical fibers may be obtained both in polarization maintaining and non-polarization maintaining varieties. For the present purpose of discussion of this invention in all of its embodiments and further extensions, the term "single mode fiber" may be used to include both single mode fiber, and low-order multimode fiber operated with single mode propagation, as well as polarization maintaining and non-polarization maintaining variants.

The optics assembly 20 is optically coupled to the laser source 10, receives the laser beam LB1 and processes the laser beam LB1 into one or multiple second laser beams LB2. In this embodiment, the optics assembly 20 includes a shutter 21, a stop 22 and a coupler 29 disposed on an optical path OP from the laser source 10 to the fiber assembly 30 in order. The shutter 21 is optically coupled to the laser source 10. The coupler 29 is coupled to a first end 31 of the fiber assembly 30. The stop 22 is disposed between the shutter 21 and the coupler 29.

In this embodiment, a single mode fiber (SMF) serves as an example of the fiber assembly 30. However, the invention is not particularly restricted thereto. A range of an operating wavelength of the fiber assembly 30 covers a wavelength of the second laser beam LB2, such that the laser beams LB2 can be smoothly and effectively transmitted in the fiber assembly 30. The first end 31 of the fiber assembly 30 is optically coupled to the optics assembly 20, and the fiber assembly 30 processes the laser beam LB2 into a single mode and stable coherent third laser beam LC without spatial noise. In the following description, it is obtained that the ratio of a transverse electric wave intensity of the third laser beam to a transverse magnetic wave intensity of the third laser beam is greater than 100. The coherence of the laser is for describing the ability of interference between two waves, whereas the laser with the higher coherence can generate the interference fringes with the higher contrast ratio.

The holder 40 is coupled to a second end 32 of the fiber assembly 30. The exposure stage 50 carries a to-be-exposed object 51 and a reflecting mirror 52 disposed perpendicular to each other. However, the invention is not particularly restricted thereto, and the included angle between the to-be-exposed object and the reflecting mirror may also be properly adjusted according to the interference pattern to be formed. The to-be-exposed object 51 may be any object (e.g., a substrate coated with a photoresist layer), on which the lithography is to be performed. After the photoresist layer is exposed and developed, the desired periodic structure can be formed.

A first portion LC1 of the third laser beam LC illuminates the reflecting mirror 52 and is reflected from the reflecting mirror 52 to the to-be-exposed object 51. A second portion LC2 of the third laser beam LC interferes with the first portion LC1 of the third laser beam LC to form an interference pattern on the to-be-exposed object 51. No pinhole spatial filter and no beam expander are disposed on the optical path OP from an output end 11 of the laser source 10 to the exposure stage 50.

In this embodiment, the architecture based on the Lloyd's mirror is proposed, and the conventional pin hole spatial filter and beam expander are replaced with the single mode fiber, so that an interference lithography system with the enhanced stability during the LIL exposure process can be configured.

In addition, the LIL apparatus 1 may further include a fiber driving mechanism 60, a stage driving mechanism 70 and an exposure dosage control module 80.

The holder 40 is mounted on the fiber driving mechanism 60. The fiber driving mechanism 60 drives the holder 40 to move and/or rotate. The exposure stage 50 is mounted on the stage driving mechanism 70. The stage driving mechanism 70 drives the exposure stage 50 to move and/or rotate. The fiber driving mechanism 60 and the stage driving mechanism 70 may be provided concurrently or independently. Rotating the holder 40 or the exposure stage 50 can adjust the size, shape, and position of the exposure area and the period of the nanostructure. Moving the holder 40 or the exposure stage 50 can adjust the exposure distance, which can also be used to adjust the size of the exposure area.

The exposure dosage control module 80 controls the exposure dosage of the third laser beam LC on the to-be-exposed object 51. In this embodiment, the exposure dosage control module 80 includes a photosensor 81 and a processor 82. The photosensor 81 receives a third portion LC3 of the third laser beam LC and thus generates an intensity signal S1. The processor 82, electrically connected to the photosensor 81 and the shutter 21 of the optics assembly 20, controls the shutter 21 to open and close according to the intensity signal S1 and an elapsed time. For example, the light intensities on the time axis are integrated to obtain the exposure dosage. At the beginning, the processor 82 can open the shutter 21 to perform the exposure while the intensity signal S1 is measured and accumulated. When the accumulated exposure dosage reaches the set exposure dosage, the processor 82 closes the shutter 21. The use of a measured dose technique instead of a timed exposure technique compensates for variations in the exposure intensity due to laser intensity drift or other beam transmission efficiency drifts. The use of a dynamically controlled shutter is advantageous because the laser source needs not to be turned off, thereby preventing the relatively long time from being spent in starting the laser source again and allowing it to stabilize.

The photosensor 81, such as a photosensitive diode, is disposed behind the reflecting mirror 52 on, for example but without limitation to, the exposure stage 50, thereby preventing the reflected light from causing the additional interference during the exposure process. Therefore, after the photosensor 81 is mounted without changing the position and the angle of the fiber, the photosensor 81 detects the light intensity of the same position.

In addition, the exposure stage 50 may include an object driving mechanism 53. The to-be-exposed object 51 is mounted on the object driving mechanism 53, which rotates the to-be-exposed object 51 to multiple orientation angles to perform multiple exposure processes and generate multiple interference patterns. For example, two exposure processes can be performed to generate a nano-rod array. In this embodiment, the object driving mechanism 53 also has the function of holding the to-be-exposed object 51. For example, the mechanism 53 provides a horizontal suction force produced by a vacuum to hold the to-be-exposed object 51. In one example, a plane of the substrate coated with the photoresist layer is substantially perpendicular to the horizontal surface, corresponding to the paper surface on the drawing, and the holder 40 is disposed horizontally so that the optical path OP is substantially parallel to the horizontal surface. Consequently, the arrangement level of the holder 40 can be lowered so that the holder 40 is free from the interference of the external environment (e.g., temperature variation and air disturbance), and good interference result can be obtained. In addition, because no collimator is provided, the laser beam used in the LIL apparatus of this embodiment has the spherical wave rather than the plane wave. In one example, because only a small portion of the spherical wave is used and the light intensity has the Gaussian distribution, the very good and stable interference effect can be obtained using this small portion of spherical wave.

Figure 2:
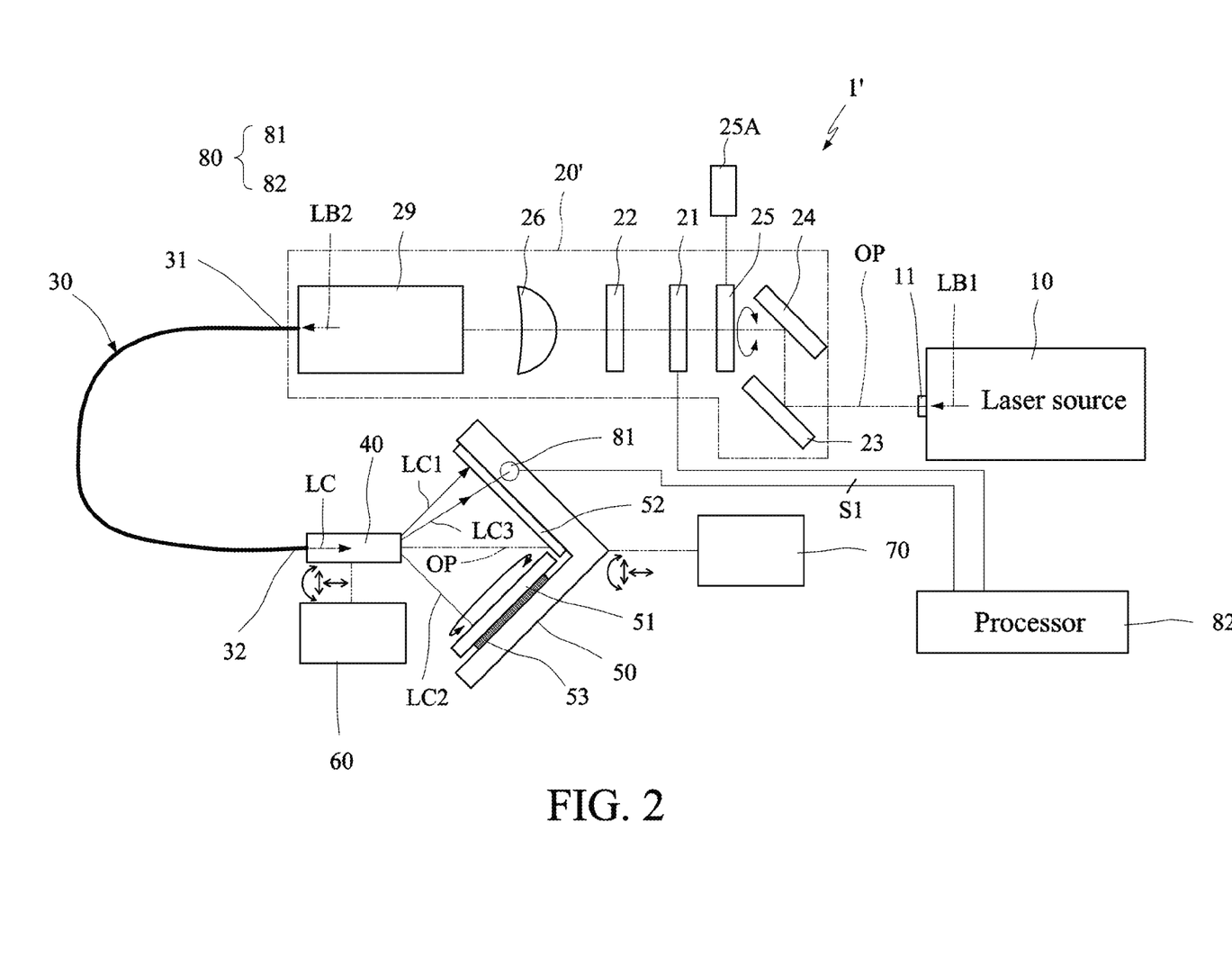

As shown in FIG. 2, this embodiment is similar to the first embodiment except that the optics assembly 20 of the LIL apparatus 1' includes a first reflecting mirror 23, a second reflecting mirror 24, a half-wave plate 25, a shutter 21, a stop 22, a lens 26 and a coupler 29 disposed on the optical path OP from the laser source 10 to the fiber assembly 30 in order. The first reflecting mirror 23 and the second reflecting mirror 24 can be adjusted to reflect the laser beam LB1 to the half-wave plate 25. The half-wave plate 25 regulates the linear polarization of the laser beam LB1 to a predetermined polarization angle. The shutter 21 controls the exposure time. The stop 22 filters out the high-intensity spatial noise of the laser beam LB1, and the lens 26 further processes the laser beam LB1. The advantage of adopting such the architecture is to make the arrangement of the optical path more flexible and to adjust the degree(s) of freedom to obtain the desired laser beam. Further descriptions will be made in the following.

Regarding the light source pre-setting, the laser source 10 outputs the laser beams, which are reflected by two reflecting mirrors 23 and 24 parallel to each other. This mechanism has four degrees of freedom, and thus can precisely adjust the position and the angle of the light source. At this time, the laser beam may be parallel to the designed optical axis. The laser beam passes through the half-wave plate 25, which functions to rotate the linear polarization of the laser beam to the required polarization angle and provide the required polarized light for LIL. Then, the shutter 21 controls the exposure time. The tunable stop 22 is disposed behind the shutter 21 and controlled by a two-axis platform to restrict the entrance region of the laser beam, thereby removing spatial noise having the higher light intensity.

Regarding the fiber alignment and coupling, the lens 26 controlled by the precise two-axis platform focuses the laser beam into a light spot with the diameter chosen to correspond to the size of the fiber propagation mode. This diameter can range from about 2 microns to several microns, depending on the specific design of the fiber being used. Another precise three-axis platform precisely places the fiber assembly 30 on the focus in an aligned manner so that the light beam and the fiber have matched modes, and the laser beam is coupled into the fiber. The precise control can increase the light coupling efficiency.

Regarding the exposure system and the lithography system, the focused laser beam is controlled by the alignment platform and guided into the fiber assembly 30. Because the fiber has the relatively small mass and is flexible, the first end (input end) 31 and the second end (output end) 32 can be adapted and mounted on standard optical mechanisms without special carrying mechanism. The output end 32 of the fiber assembly 30 can be adapted by a standard FC adapter, and a FC adapter ring mounted on a support mechanism with three degrees of freedom carries the fiber assembly 30. The FC connector is used here only as an example, since it is a standard, readily available component. Other detachable connector designs may be used. The support mechanism may be constituted by an anti-vibration column, an adjustable Z-axis stage, an adjustable rotation platform and a tunable fiber rotation ring. By adjusting the distance in the Z axis (the axis perpendicular to the optical table) and the angle of the rotation platform, the size of the exposure area and the period of the nano-structure can be adjusted. The fiber rotation ring is coaxial with the fiber, so the ring can be rotated to reduce the accumulated stress, which is caused by the bending of the fiber and causes different refractivities in the fiber and thus the birefringence phenomenon that eliminates the linear polarization. Thus, the contrast ratio of the linear polarization can be maintained. Further, in the case where a polarization maintaining type fiber is used, this rotation may be used to control the final polarization angle of the beam, in conjunction with the half-wave plate.

In an example, when the optical fiber 30 is a non-polarization maintaining fiber, the optics assembly 20 preferably includes the half-wave plate 25 and a tuner 25A, connected to the half-wave plate 25, for rotating the half-wave plate 25 to tune a polarization direction of the second laser beam LB2 to produce a required polarization direction of the third laser beam LC without rotating the non-polarization maintaining fiber. The tuner 25A may be actuated by the user or may include a motor (not shown) powered by the electric power source of the LIL. By rotating the half-wave plate 25, the polarization direction of the light injected into the fiber can be adjusted to produce the required polarization at the output. Because the polarization direction is unpredictably rotated by the orientation and routing of the fiber, the half-wave plate is disposed at the input side of the fiber to tune the polarization direction at the output. As the fiber is flexible, the beam direction and location are completely determined by repositioning the end of the fiber. Thus, no other laser beam transport components need to be adjusted. In the case where a polarization maintaining (PM) fiber is used, the half-wave plate can serve to adjust the incoming polarization angle to align or match exactly with the fast propagation axis of the PM fiber in the fast mode or a slow propagation axis of the PM fiber in the slow mode and to rapidly switch between the fast and slow modes to alternate between TE and TM polarization of each of the third laser beams without rotating the PM fiber, in order to prevent the production of an unstable, elliptically polarized beam at the output end. Once properly adjusted, the half-wave plate can also be rotated by exactly 90 degrees to quickly change from TE to TM polarized light at the output of the fiber, depending on the exposure requirements. This switching is therefore remote and does not require rotation of the output end of the fiber. The definition of the PM fiber can be obtained from: (a). http://www.rp-photonics.com/polarization_maintaining_fibers.html; and (b) http://en.wikipedia.org/wiki/Polarization-maintaining_optical_fiber, both of which are incorporated herein by reference.

Figure 3:
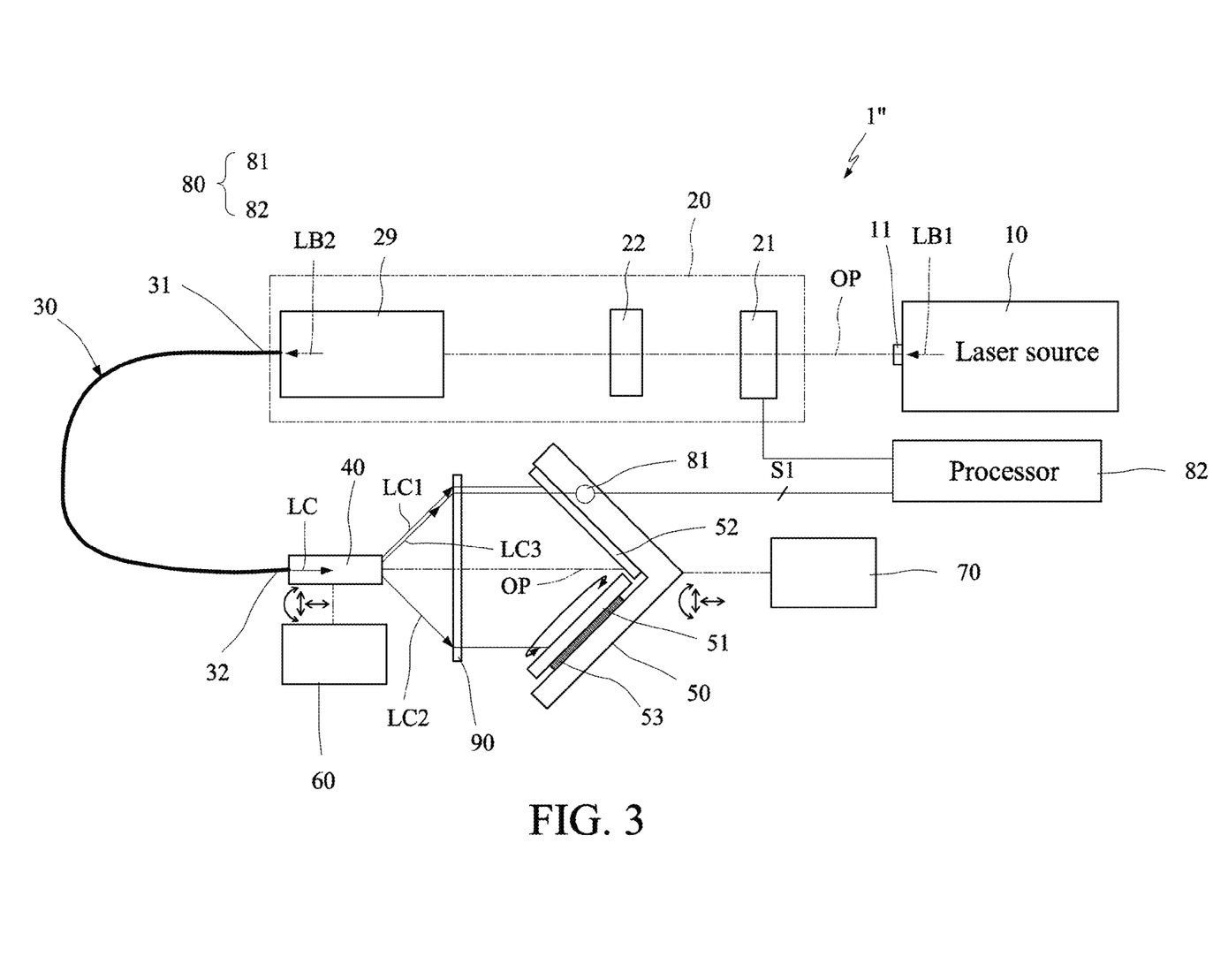

Referring to FIG. 3, this embodiment is similar to the first embodiment except that the LIL apparatus 1″ further includes a collimator 90, which is disposed on the optical path OP and between the holder 40 and the exposure stage 50, and processes the third laser beam LC into a collimated beam. There are multiple advantages of adopting this architecture. One is to provide a collimated beam for the generation of the required interference pattern, without any minor pattern distortion or non-uniformity in period resulting from spherical wave illumination. A beam collimator can also be used to provide a method to adjust the beam diameter on the sample, without moving either the fiber mount or the sample mount, by changing the focal length of the collimator and its distance to the fiber output. It is to be noted that, in the first and second embodiments, the collimator can be completely removed from the optical path OP. So, the invention is not limited to the use of the collimator.

Figure 4A:
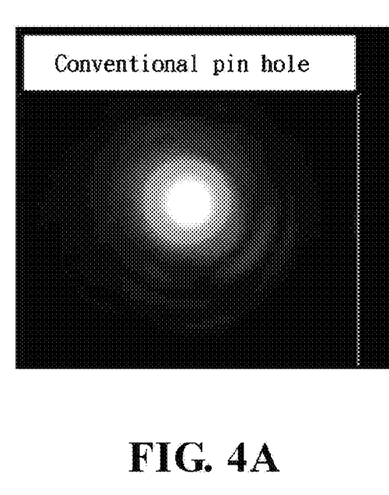
FIGS. 4A and 4B show beam profiles obtained using the single mode fiber of the invention and the conventional pin hole.
Figure 4B:
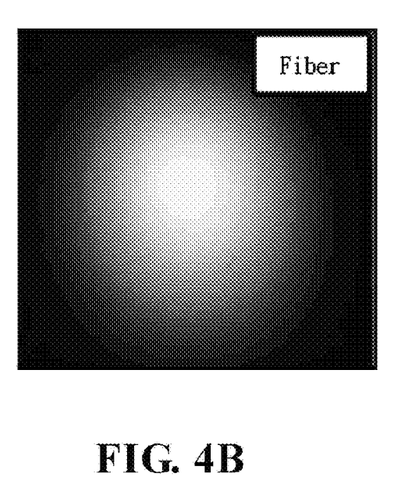

Experimental illustrations for the architecture of the first embodiment will be made in the following. In order to distinguish the effect caused by the single mode fiber of this embodiment from the effect caused by the conventional pin hole, beam profiles of the laser source for exposing the to-be-exposed object will be described in the following. The beam profiles of the single mode fiber spatial filter and the pin hole spatial filter are shown in FIGS. 4A and 4B, respectively. For the system applying the pin hole spatial filter, when a focused laser spot moves, it may touch the edge of the pin hole and cause the fringe or change the shape of the output beam. Therefore, in the pin hole spatial filter system, instabilities of the input laser beam not only cause intensity variation but also change the shape of the output laser beam. These would be the reasons of failure in LIL. For the system using the SMF spatial filter, no matter how a focused laser spot may move at the input of the fiber, the single mode radiation from the core of the other end of the fiber is remained mechanically fixed in space and direction. Further, no matter what the spatial intensity distribution of the laser spot looks like, the spatial distribution of the light from the output is fixed and determined by the nature of the fiber mode. Therefore, instabilities of the laser beam can cause the spot to move and change the shape at the input side of the fiber, but at the other end of the fiber only the pure single mode expands into space with all spatial noise and positional drift being eliminated.

Figure 5A:
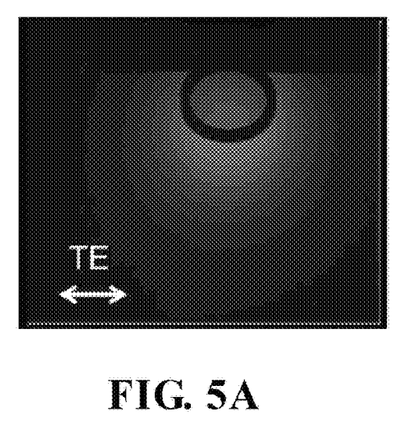
FIGS. 5A and 5B show beam profiles obtained when the UV polarizer is placed at the output end of the fiber and a fluorescent screen, respectively.
Figure 5B:
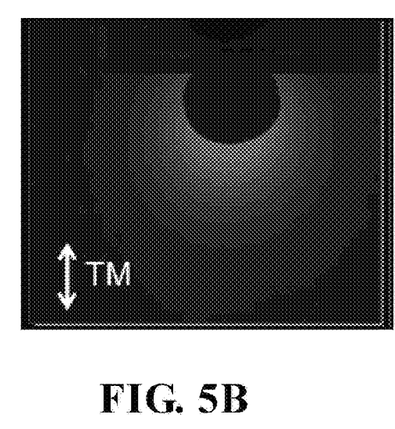

In the situation where a scattering plane can be defined, light can be divided into transverse-electric (TE) wave and transverse-magnetic (TM) wave components, where the electric field vibration direction of the electric field of the TE wave is perpendicular to the plane-of-incident, and the electric field vibration direction of the TM wave falls within the plane. The electric fields of two beams are kept to be substantially parallel with each other on the sample in order to maximize the contrast between constructive and destructive interference. A TE polarized beam is used to achieve this condition. To demonstrate that the beam of light exiting the fiber is linearly polarized and can be rotated to the correct direction, a fluorescent screen is placed on the optical table illuminated by the UV beam. This produces the bright blue fluorescence (see the brighter portion in the gray scale patterns), as shown in FIGS. 5A and 5B. Then, a UV polarizer is placed on the path of the beam. By rotating the polarizer, it is shown that the light was indeed strongly polarized, and could be set to the correct orientation. FIGS. 5A and 5B show beam profiles obtained when the UV polarizer is placed at the output end of the fiber and the fluorescent screen, respectively. FIG. 5A shows that the TE wave can penetrate through the polarization plate. FIG. 5B shows that the TM wave cannot penetrate through the polarization plate. We can always obtain a null (ratio of the TE to TM intensities) of at least 100:1. In practice, the orientation of the beam is monitored by the transmission through a crossed polarizer, and the half-wave plate is rotated to minimize or null the transmitted TM wave component. Considering that the He Cd laser polarization itself is only rated at 100:1, and the extinction ratio of the UV polarizer is about 200:1, it is believed that the actual achievable polarization purity of the fiber system by itself may be significantly better.

Figure 6:
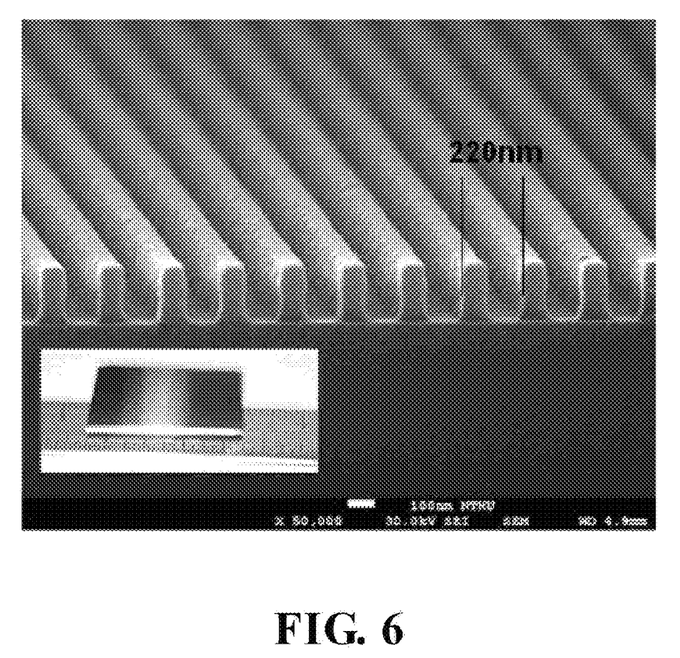
FIGS. 6 and 7 show SEM images of two gratings obtained according to the first embodiment of the invention.
Figure 7:
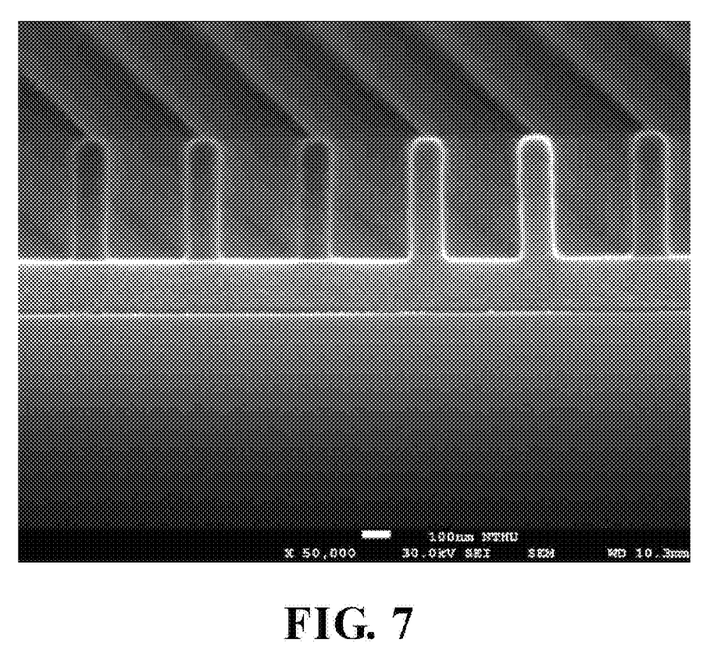

FIGS. 6 and 7 show SEM images of two gratings obtained according to the first embodiment of the invention. In FIGS. 6 and 7, the structures of the gratings (or referred to as a one-dimensional nano-scale periodic structure) are obtained by way of LIL and one single exposure process according to the first embodiment of the invention, wherein the structure of FIG. 6 has the pitch of 220 nm, while the structure of FIG. 7 has the pitch of 400 nm. The structures with different pitches can be fabricated by using the fiber driving mechanism 60 to rotate the holder 40 or the exposure stage 50 in order to change the incident angle of the laser beam coming from the fiber.

Figure 8:
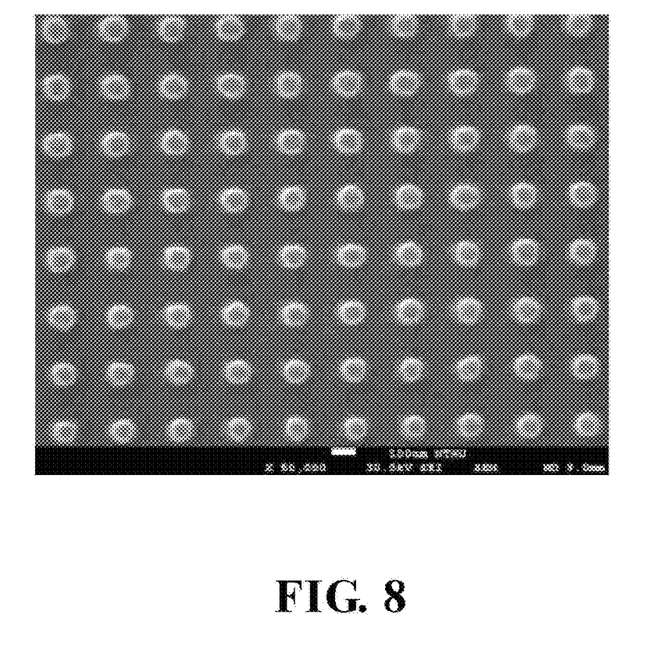
FIGS. 8 and 9 show SEM images of two arrays of nanorods obtained according to the first embodiment of the invention.
Figure 9:
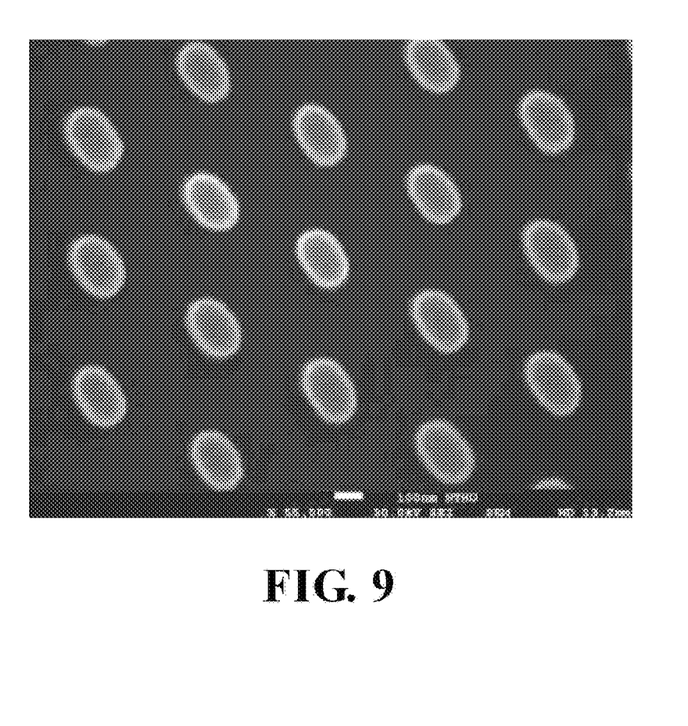

FIGS. 8 and 9 show SEM images of two arrays of nano-rods obtained according to the first embodiment of the invention. In FIGS. 8 and 9, the structures of the gratings (or referred to as a two-dimensional nano-scale dot array structure) are obtained by way of LIL and two exposure processes according to the first embodiment of the invention. In FIG. 8, after the first exposure process, the to-be-exposed object is rotated by 90 degrees and then the second exposure process is performed, so that a nano-rod array structure can be formed with a rectangularly spaced pattern. In FIG. 9, after the first exposure process, the to-be-exposed object is rotated by 60 degrees and then the second exposure process is performed, so that the nano-rod array structure can be formed with a hexagonal pattern.

Therefore, the invention provides a stable LIL apparatus by adopting a single mode fiber (SMF) as a beam transmission path to replace the pin hole spatial filter and beam expander. The linear polarized light coming from the He Cd laser ($\lambda$=325 nm) is coupled into one end of the SMF, and the expanded beam coming from the other end of the SMF is used for the LIL exposure of the Lloyd's mirror architecture. Using the output of the fiber as the light source for the LIL system can enhance the pointing stability of the laser. Although the SMF is not polarization maintaining, the fiber can stably preserve the linear polarized light with (the transverse electric wave intensity)$I_{TE}$: (the transverse magnetic wave intensity) $I_{TM}$>100. In this system, the gratings are produced easily in photoresist with a period (or pitch) of 220 nm over an area of several square centimeters. The exposure time over 10 minutes with expanded beams results in high contrast patterns without any need for active feed-back or fringe-locking.

According to the above-mentioned embodiments of the invention and the experimental verification, it is found that the single mode fiber can replace the conventional pin hole spatial filter and also serve as the laser beam transmission medium, maintain the stable linear polarization and its correct orientation which in this case is TE, and provide the pure, stable and coherent laser beam for the interference lithography. In the fiber system, any disturbance to the environment stability or laser orientation in front of the fiber end is converted, by the fiber, into the value of the light coupling efficiency, and cannot affect the wavefront and orientation of the output end of the fiber. Thus, in the optical path design of the fiber, only the output end of the fiber affects the pointing stability and position of the light source.

As mentioned hereinabove, the wavefront separation LIL technology, which is also the Lloyd's mirror based LIL technology, is described, wherein one laser beam is adopted. However, the invention is not restricted thereto, but may also be applied to the amplitude separation LIL technology, in which two or multiple laser beams are adopted to perform the interference lithography. Examples thereof will be described in the following.

Figure 10:
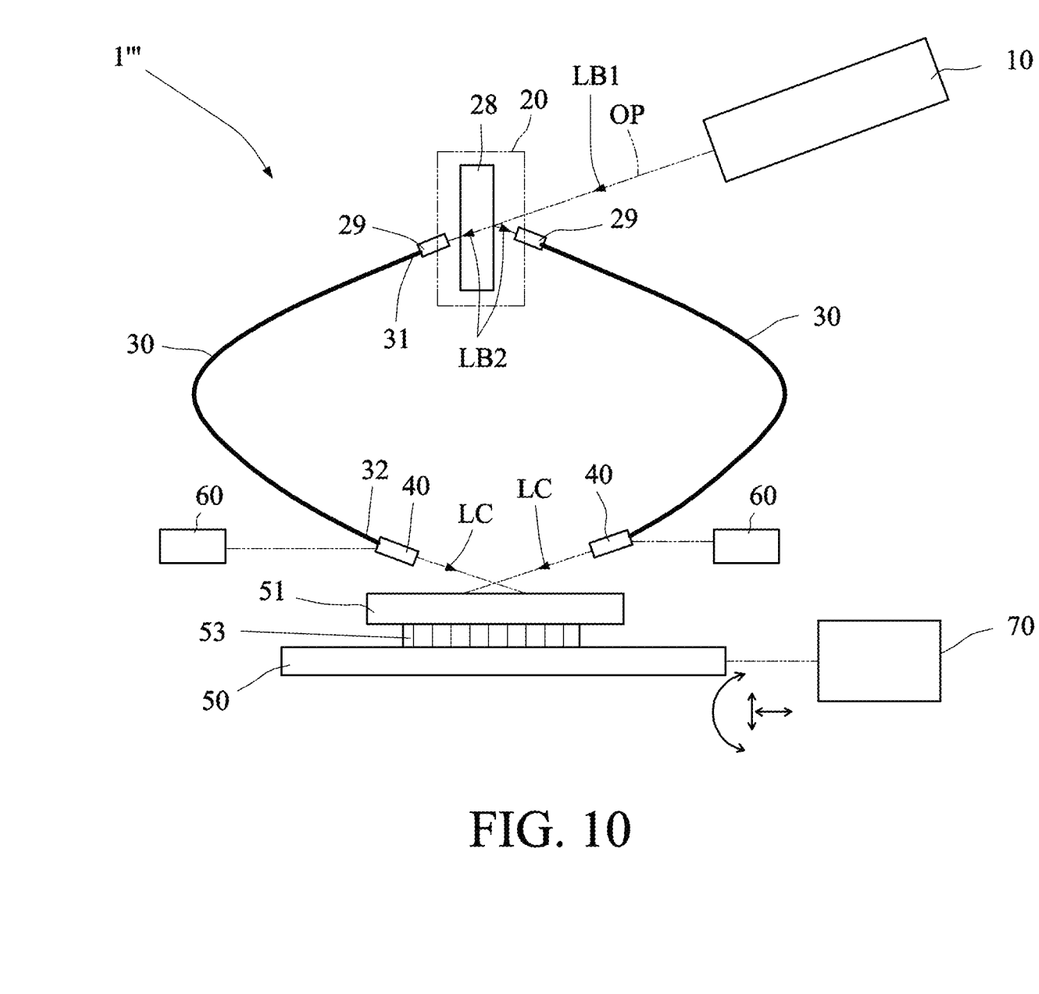
FIGS. 10 and 11 are schematic illustrations showing LIL apparatuses according to the fourth and fifth embodiments of the invention.

As shown in FIG. 10, the LIL apparatus 1''' of the fourth embodiment is similar to the first embodiment except that the optics assembly 20 receives and processes the first laser beam LB1 into two second laser beams LB2. In addition, the fiber assembly 30 receives the two second laser beams LB2 and processes the two second laser beams LB2 into two single mode and stable coherent third laser beams LC without spatial noise, respectively. The two third laser beams LC interfere with each other to form the interference pattern on the to-be-exposed object 51. In order to provide the two second laser beams LB2, the optics assembly 20 includes a beam splitter 28 for achieving the beam splitting effect. Therefore, the fiber assembly 30 of this embodiment includes two fibers. The first ends 31 of the fibers are optically coupled to the optics assembly 20, and two holders 40 are coupled to the second ends 32 of the fibers 30. By arranging or adjusting the two holders 40, the two third laser beams LC can interfere with each other to form the interference pattern on the to-be-exposed object 51. Thus, the fiber can replace the elements, such as the reflecting mirror, the attenuator, the pin hole spatial filter, the lens and the like, which are needed in the prior art. The parameters of interference lithography can be adjusted by only adjusting the holders 40, thereby eliminating additional complexity of design. It is to be noted that the LIL apparatus 1''' requires the active phase locking to ensure the correct phases of the two third laser beams LC. In a non-restrictive example, the phase locker is combined with the holder 40. Thus, the holder 40 may provide the function of supporting the fiber as well as the phase locking function. Since the active phase locking is well known in the art, detailed descriptions thereof will be omitted.

Figure 11:
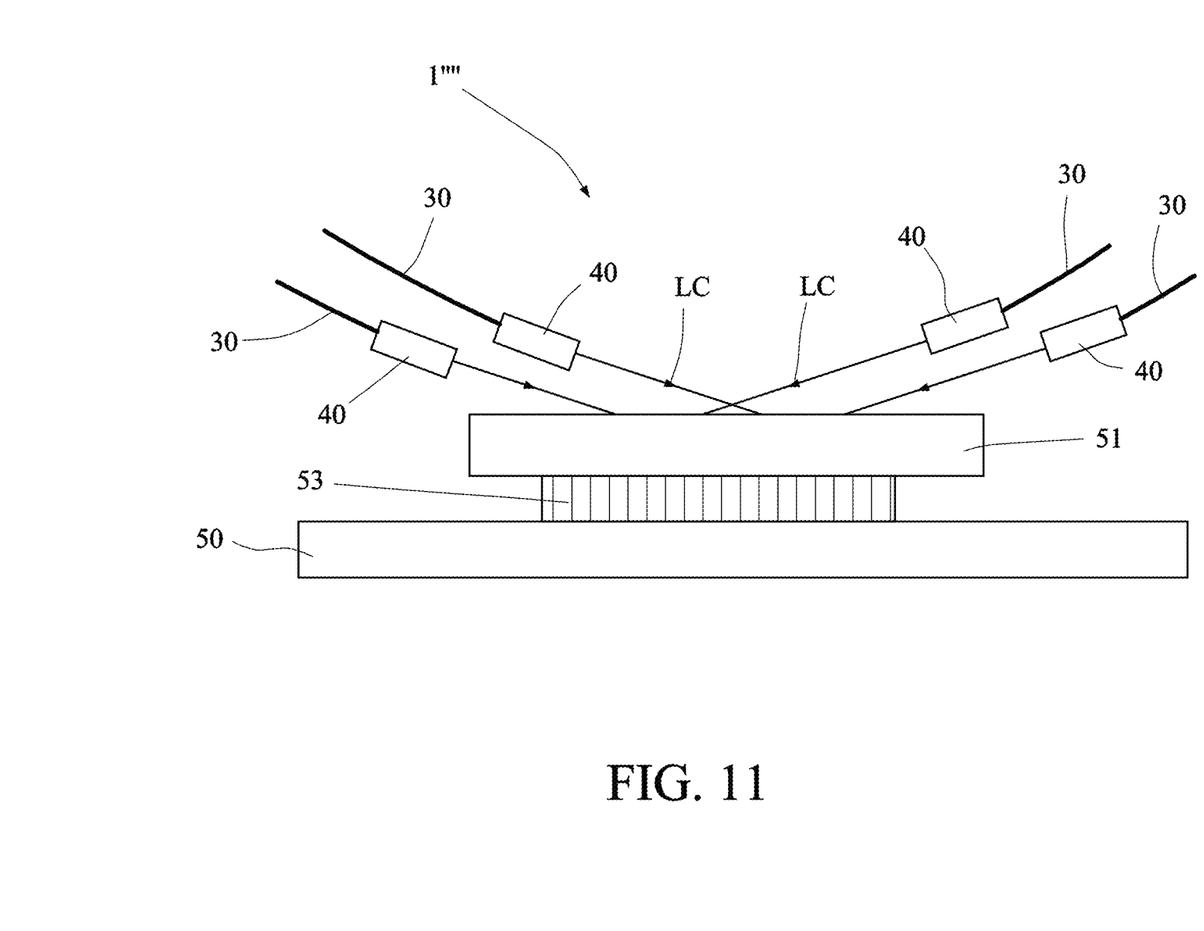

As shown in FIG. 11, the LIL apparatus 1'''' of the fifth embodiment is similar to the fourth embodiment except that this embodiment uses four laser beams, four optical fibers 30 and four holders 40 to achieve the interference lithography of multiple beams. The four laser beams can be generated by adopting multiple beam splitters, which have been well known in the art. It is to be noted that all the applicable additional elements of the above-mentioned embodiments can be exchanged all over these embodiments according to the requirements. It is further understood that other numbers of beams, such as three, five, six, eight or more can also be used, depending on the particular types of patterns to be produced.

It is well understood to those in the art that when amplitude division is used, such as in multiple beam interference lithography, it is essential that the phase relationship between the two or multiple beams be maintained with high stability, and that their relative intensities be held stable as well. The inclusion of additional phase and intensity monitors is well understood in the art, and would naturally be included in these embodiments. These signals would be used to control corresponding intensity and phase shifting devices for each beam. A wide variety of methods to modulate the intensity and phase of these beams are well known in the art, and are too numerous to describe as separate embodiments. However, these may include mechanical translation of fiber ends, dynamic mechanical or thermal modifications to the fibers, or the insertion of additional optical elements which may be controlled by mechanical, thermal, or electrical feedback signals. None of these modifies in any way the current invention, but can be included in any combination in any of the multiple beam embodiments to achieve phase and intensity matching.

The invention uses the fiber to replace the frequently used pin hole spatial filter and beam expander and to achieve the effects the same as those of the spatial filter and beam expander. Because the fiber has the light beam guiding effect, can rearrange the optical energy into the good Gaussian or Gaussian-like distribution and cannot change the optical shape at the output end of the fiber into the non-Gaussian distribution due to the unstable orientation of the laser source at the input end of the fiber, the fiber adopted in this invention can replace a lot of optical devices and significantly increase the flexibility of designing the optical path. The original properties of the fiber and the light source can be preserved as long as the bending radius of the fiber is greater than or equal to the minimum bending radius of the fiber. According to the above-mentioned properties, the optical path can be constructed within the very limited space, and the environmental factor, such as the environmental temperature gradient influence, can be effectively decreased. Furthermore, the adjustment of the optical path of the fiber can be made by only adjusting the input end and the output end of the fiber without considering the calibration, contamination and defect of the reflecting mirror or mirrors. Moreover, the fiber has the small size and the light weight, can be easily mounted or fixed by the designed mechanisms, and can be integrated with any optical mechanism. The output position and angle of the light beam transmitted in the optical fiber can be controlled by controlling the output end of the fiber. Therefore, the excellent stability and extensibility of the light source can be provided. Because the optical fiber can effectively filter out the spatial noise, the pure, stable and coherent laser beam (without the spatial noise) for the interference lithography can be obtained.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A laser interference lithography apparatus, comprising:
a laser source providing a first laser beam;
an optics assembly, which is optically coupled to the laser source, receives the first laser beam and processes the first laser beam into one or multiple second laser beams;
an exposure stage for carrying a to-be-exposed object; and
a fiber assembly, which receives the one or multiple second laser beams and processes the one or multiple second laser beams into one or multiple single mode and stable coherent third laser beams, wherein a range of an operating wavelength of the fiber assembly covers a wavelength of the second laser beam, an interference pattern is generated on the to-be-exposed object using the one or multiple third laser beams, and an optical path is formed from an output end of the laser source to the exposure stage, wherein the optics assembly provides the one second laser beam, the fiber assembly comprises a single optical fiber and outputs the one third laser beam, a first end of the fiber assembly is optically coupled to the optics assembly, and the laser interference lithography apparatus further comprises a holder coupled to a second end of the fiber assembly, wherein the exposure stage carries a reflecting mirror, a first portion of the third laser beam illuminates the reflecting mirror and is reflected, by the reflecting mirror, to the to-be-exposed object, and a second portion of the third laser beam interferes with the first portion of the third laser beam on the to-be-exposed object to generate the interference pattern.

2. The apparatus according to claim 1, further comprising:
a fiber driving mechanism, wherein the holder is mounted on the fiber driving mechanism, and the fiber driving mechanism drives the holder to move or rotate.

3. The apparatus according to claim 1, further comprising:
a stage driving mechanism, wherein the exposure stage is mounted on the stage driving mechanism, and the stage driving mechanism drives the exposure stage to move or rotate.

4. A laser interference lithography apparatus, comprising:
a laser source providing a first laser beam;
an optics assembly, which is optically coupled to the laser source, receives the first laser beam and processes the first laser beam into one or multiple second laser beams;
an exposure stage for carrying a to-be-exposed object;
a fiber assembly, which comprises a single optical fiber or multiple optical fibers, receives the one or multiple second laser beams and processes the one or multiple second laser beams into one or multiple single mode and stable coherent third laser beams, wherein a range of an operating wavelength of the fiber assembly covers a wavelength of the second laser beam, an interference pattern is generated on the to-be-exposed object using the one or multiple third laser beams, and an optical path is formed from an output end of the laser source to the exposure stage; and
an exposure dosage control module controlling an exposure dosage of the third laser beam on the to-be-exposed object, wherein the exposure dosage control module comprises:
a photosensor, which receives a third portion of the third laser beam and generates an intensity signal; and
a processor, which is electrically connected to the photosensor and a shutter of the optics assembly and controls the shutter to open and close according to the intensity signal and an elapsed time.

5. The apparatus according to claim 1, wherein the optics assembly comprises a shutter, a stop and a coupler disposed on the optical path from the laser source to the fiber assembly in order, wherein the shutter is optically coupled to the laser source, the coupler is coupled to the first end of the fiber assembly, and the stop is disposed between the shutter and the coupler.

6. The apparatus according to claim 1, wherein the optics assembly comprises a first reflecting mirror, a second reflecting mirror, a half-wave plate, a shutter, a stop, a lens and a coupler disposed on the optical path from the laser source to the fiber assembly in order, wherein the first reflecting mirror and the second reflecting mirror are adjustable so as to reflect the first laser beam to the half-wave plate, the half-wave plate regulates a linear polarization of the first laser beam to a predetermined polarization angle, the shutter controls an exposure time, the stop filters out high-intensity spatial noise of the first laser beam, and the lens processes the first laser beam.

7. The apparatus according to claim 1, further comprising:
a collimator, which is disposed on the optical path and between the holder and the exposure stage, and processes the third laser beam into a collimated beam.

8. The apparatus according to claim 1, wherein the exposure stage comprises an object driving mechanism, wherein the to-be-exposed object is mounted on the object driving mechanism, which rotates the to-be-exposed object to multiple orientation angles to perform multiple exposure processes and generate multiple interference patterns.

9. The apparatus according to claim 8, wherein the to-be-exposed object is rotated about a horizontal axis.

10. The apparatus according to claim 1, wherein a ratio of a transverse electric wave intensity of the stable and coherent third laser beam to a transverse magnetic wave intensity of the stable and coherent third laser beam is greater than 100.

11. The apparatus according to claim 1, wherein the optics assembly provides the multiple second laser beams, the fiber assembly comprises multiple optical fibers optically coupled to the optics assembly and outputs the multiple third laser beams, first ends of the optical fibers are optically coupled to the optics assembly, and the laser interference lithography apparatus further comprises multiple holders coupled to second ends of the optical fibers, wherein the holders are configured such that the multiple third laser beams generate the interference pattern on the to-be-exposed object.

12. A laser interference lithography apparatus, comprising:
a laser source providing a first laser beam;
an optics assembly, which is optically coupled to the laser source, receives the first laser beam and processes the first laser beam into one or multiple second laser beams;
an exposure stage for carrying a to-be-exposed object; and
a fiber assembly, which receives the one or multiple second laser beams and processes the one or multiple second laser beams into one or multiple single mode and stable coherent third laser beams, wherein a range of an operating wavelength of the fiber assembly covers a wavelength of the second laser beam, an interference pattern is generated on the to-be-exposed object using the one or multiple third laser beams, and an optical path is formed from an output end of the laser source to the exposure stage, wherein the fiber assembly comprises a single optical fiber or multiple optical fibers, and the optics assembly includes a half-wave plate and a tuner, connected to the half-wave plate, for rotating the half-wave plate to tune a polarization direction of the second laser beam.

13. The apparatus according to claim 12, wherein the optical fiber or each of the optical fibers is a polarization maintaining fiber, and the tuner rotates the half-wave plate to tune the polarization direction of the second laser beam to match exactly either a fast propagation axis of the polarization maintaining fiber in a fast mode or a slow propagation axis of the polarization maintaining fiber in a slow mode, and to rapidly switch between the fast and slow modes to alternate between transverse-electric (TE) and transverse-magnetic (TM) polarization of each of the third laser beams without rotating the polarization maintaining fiber.

14. The apparatus according to claim 12, wherein the optical fiber or each of the optical fibers is a non-polarization maintaining fiber, and the tuner rotates the half-wave plate to tune the polarization direction of the second laser beam to produce a required polarization direction of the third laser beam without rotating the non-polarization maintaining fiber.

* * * * *